US010041657B2

(12) United States Patent
Lenz et al.

(10) Patent No.: US 10,041,657 B2
(45) Date of Patent: Aug. 7, 2018

(54) CLIP UNIT AND EDGE MOUNTED LIGHT EMITTING DIODE (LED) ASSEMBLY COMPRISING A CLIP UNIT

(71) Applicant: Rebo Lighting & Electronics, LLC, Ann Arbor, MI (US)

(72) Inventors: Orin Lenz, Canton, MI (US); John Dominick, Ann Arbor, MI (US); Stephen Kowalchik, Dexter, MI (US)

(73) Assignee: Rebo Lighting & Electronics, LLC, Ann Arbor, MI (US)

(*) Notice: Subject to any disclaimer, the term of this patent is extended or adjusted under 35 U.S.C. 154(b) by 105 days.

(21) Appl. No.: 15/180,893

(22) Filed: Jun. 13, 2016

(65) Prior Publication Data

US 2017/0356630 A1 Dec. 14, 2017

(51) Int. Cl.

| | |
|---|---|
| ***H01R 12/00*** | (2006.01) |
| ***F21V 19/00*** | (2006.01) |
| ***H01L 33/48*** | (2010.01) |
| ***H01L 33/62*** | (2010.01) |
| ***B60Q 1/30*** | (2006.01) |
| ***B60Q 1/32*** | (2006.01) |

(Continued)

(52) U.S. Cl.

CPC .............. *F21V 19/003* (2013.01); *B60Q 1/30* (2013.01); *B60Q 1/323* (2013.01); *F21S 43/14* (2018.01); *F21V 21/088* (2013.01); *H01L 33/486* (2013.01); *H01L 33/62* (2013.01); *F21Y 2101/02* (2013.01)

(58) Field of Classification Search

CPC .......... F21V 7/00; F21V 19/00; F21V 19/003; F21V 21/088; F21S 43/14; F21Y 2101/02

USPC ................. 439/36, 59, 62, 72, 83, 217–220, 439/226–249, 296, 298, 313, 325, 328, 439/351, 736, 833, 867

See application file for complete search history.

(56) References Cited

U.S. PATENT DOCUMENTS

| | | | | |
|---|---|---|---|---|
| 4,419,722 A * | 12/1983 | Bury | F21V 19/002 | 362/382 |
| 4,473,770 A * | 9/1984 | Baba | H01J 5/50 | 313/315 |

(Continued)

FOREIGN PATENT DOCUMENTS

| | | | |
|---|---|---|---|
| EP | 0434471 A1 * | 6/1991 | F21V 19/002 |
| EP | 2134146 A1 | 12/2009 | |

(Continued)

OTHER PUBLICATIONS

International Search Report and Written Opinion for Application No. PCT/US2017/037219 dated Sep. 19, 2017.

*Primary Examiner* — Michael A Lyons
*Assistant Examiner* — Milagros Jeancharles
(74) *Attorney, Agent, or Firm* — Reising Ethington, P.C.

(57) ABSTRACT

A clip unit and an edge mount light emitting diode (LED) assembly comprising a clip unit. The clip unit provides a mounting structure for mounting a light source, such as an LED, to an edge of a printed circuit board (PCB). A surface mount LED, for example, can thus be easily mounted to the edge of the PCB so as to project light in a direction normal to the edge surface of the PCB, instead of the typical mounting orientation that allows for the projection of light normal to the primary surface of the PCB. The clip unit includes an anode retention clip and a cathode retention clip which are electrically isolated from one another within an insulative housing portion.

20 Claims, 3 Drawing Sheets

(51) Int. Cl.

| | |
|---|---|
| ***F21V 21/088*** | (2006.01) |
| ***F21S 43/14*** | (2018.01) |
| *F21Y 101/02* | (2006.01) |

(56) References Cited

U.S. PATENT DOCUMENTS 4,507,718 A * 3/1985 Bury ..................... F21V 19/002 362/368
4,727,648 A * 3/1988 Savage, Jr. ............ H01R 33/06 29/839
4,757,785 A * 7/1988 Klahn ................... F22B 37/483 122/382
4,818,859 A 4/1989 Hough
4,897,769 A * 1/1990 Lang ...................... H05K 3/301 362/396
5,069,640 A * 12/1991 Wasimoto ................ H01K 1/46 439/619
5,147,220 A 9/1992 Lybrand
5,437,562 A 8/1995 Michael
5,629,581 A * 5/1997 Belle ......................... H01J 5/62 313/318.12
5,639,269 A 6/1997 Vanbesien
5,807,122 A * 9/1998 Heeb ................... F21V 19/0025 439/56
5,823,799 A 10/1998 Tor
6,077,095 A 6/2000 DelPrete
6,152,568 A 11/2000 Baba
6,677,707 B1 1/2004 Dietiker
6,712,486 B1 * 3/2004 Popovich ............... A47C 7/725 362/241
6,727,652 B2 4/2004 Sivacumarran
6,985,367 B1 1/2006 Scigiel
7,319,661 B1 * 1/2008 Bohossian .......... H04W 76/028 370/216
7,670,025 B2 * 3/2010 Lee ................... G02F 1/133604 362/217.09
7,709,754 B2 5/2010 Doogue
7,841,742 B2 * 11/2010 Freeman ................. F21V 23/00 362/261
7,852,015 B1 * 12/2010 Yen ......................... F21V 23/06 257/97
7,979,977 B2 7/2011 Minteer
7,985,014 B2 * 7/2011 Tsukamoto ............. F21V 19/00 362/507
8,029,177 B2 * 10/2011 Schmierer ............ B60Q 1/2696 362/217.1
9,057,489 B2 * 6/2015 Catalano ................. F21K 9/238
9,765,935 B2 * 9/2017 Rowlette, Jr. ........... F21K 9/272
2002/0097586 A1 * 7/2002 Horowitz ................ F21S 8/035 362/545
2003/0058650 A1 3/2003 Shih
2004/0061423 A1 4/2004 Sivacumarran
2007/0030679 A1 2/2007 Lee
2008/0315214 A1 12/2008 Wall, Jr.
2012/0230031 A1 9/2012 Hayes
2013/0128573 A1 * 5/2013 Leung ..................... F21V 23/06 362/235
2014/0266171 A1 9/2014 Masser
2015/0241049 A1 * 8/2015 Pickard ................. F21V 29/507 362/294
2015/0362168 A1 * 12/2015 Power ....................... F21K 9/23 362/294
2016/0009216 A1 * 1/2016 Song ....................... F21V 19/00 362/516
2016/0082879 A1 * 3/2016 Kozole .................. B60Q 1/323 362/544

FOREIGN PATENT DOCUMENTS

FR 2576719 A1 8/1986
WO WO03028119 A2 4/2003

* cited by examiner

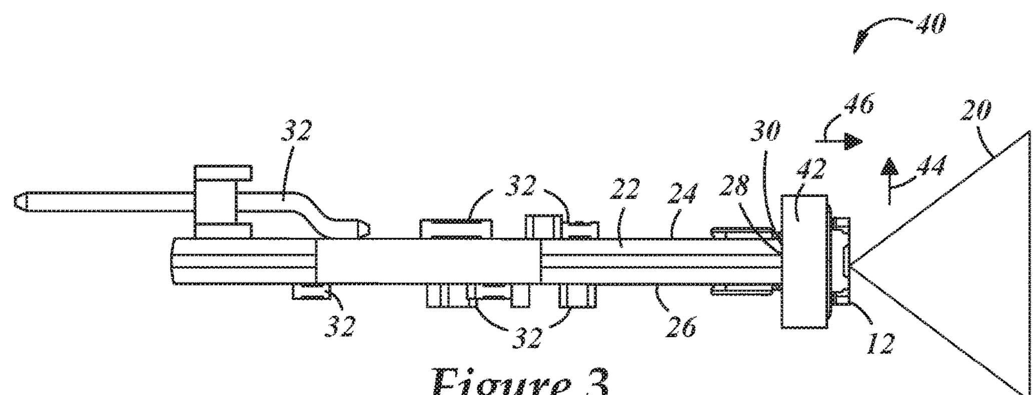
Figure 3
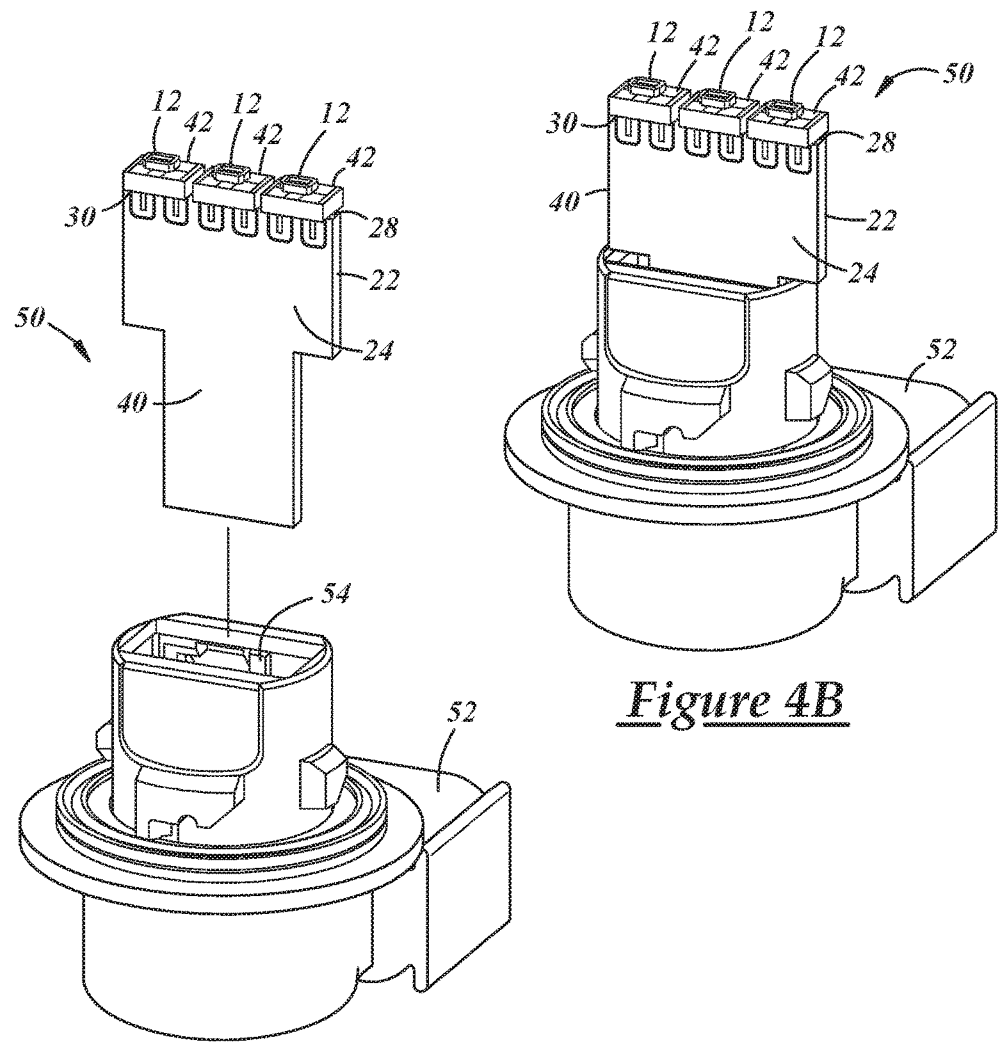
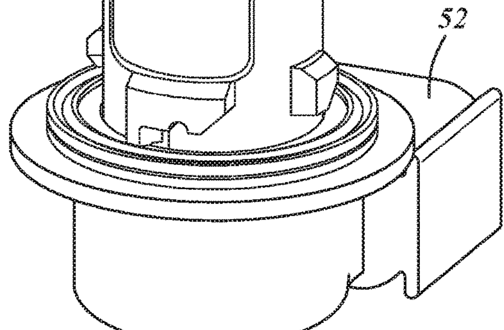
Figure 4B
Figure 4A

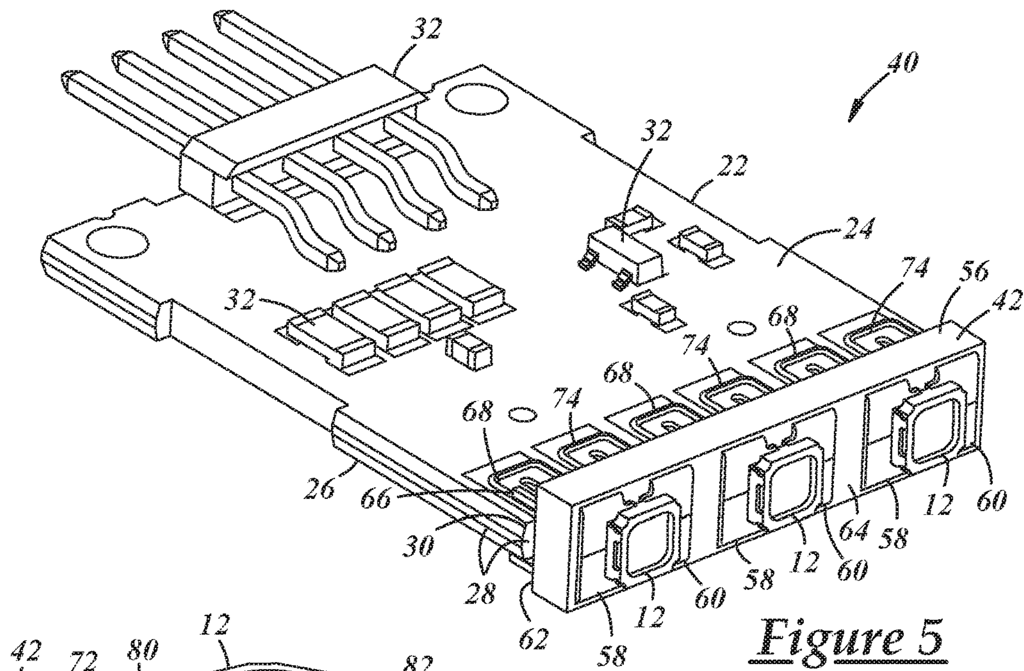
Figure 5
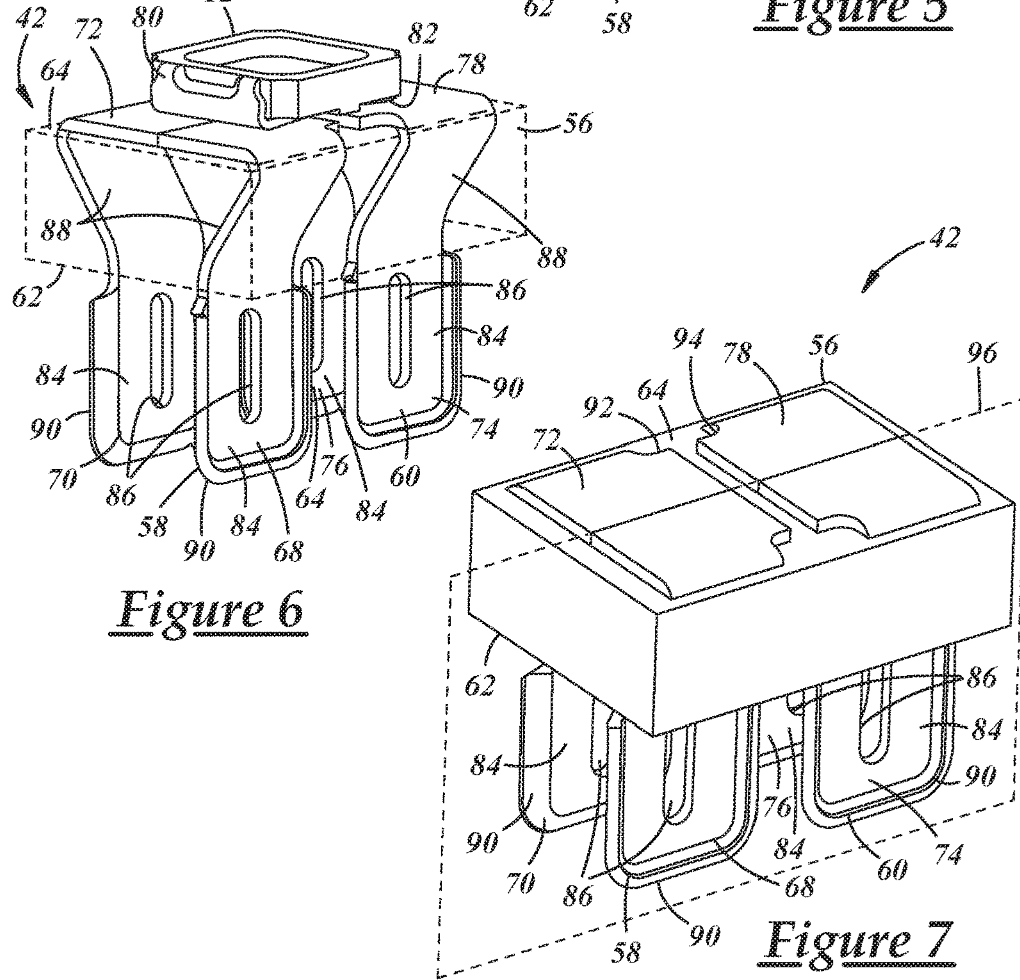
Figure 6
Figure 7

CLIP UNIT AND EDGE MOUNTED LIGHT EMITTING DIODE (LED) ASSEMBLY COMPRISING A CLIP UNIT

FIELD

The present invention relates generally to mounting units for mounting light sources on printed circuit boards (PCBs), and more particularly, to clip units for mounting light sources on the edge of PCBs which may be used in various automotive applications.

BACKGROUND

Light sources, such as light emitting diodes (LEDs) in particular, come in various forms, such as surface mount LEDs, side firing LEDs, twisted or butterfly LEDs, and other LED types. Surface mount LEDs make up a majority of the LED market. Consequently, there is more diversity among types of surface mount LEDs, which are typically available in a wider array of colors, emission levels, sizes, to cite just a few options. Also, surface mount LEDs are typically brighter than side firing LEDs. However, surface mount LEDs typically mount to a primary surface of a printed circuit board (PCB) to emit light in a direction that is normal to the primary surface of the PCB. Accordingly, it may be desirable to be able to use surface mount LEDs in a larger assortment of applications, orientations, mounting configurations, etc.

SUMMARY

According to one embodiment, there is provided a clip unit for attaching a light source to an edge of a printed circuit board (PCB). The PCB has opposing primary surfaces and an edge surface defining an edge of the PCB between the opposing primary surfaces. The clip unit comprises a housing portion, an anode retention clip, and a cathode retention clip. The housing portion is made of an electrically insulative material and having a mounting side and an illuminating side. The anode retention clip is made of an electrically conductive material and has a pair of anode legs and an anode mounting region. The anode legs oppose one another and extend within the housing portion so as to project from the mounting side of the housing portion toward the illuminating side of the housing portion. The anode mounting region connects the anode legs together and extends along the illuminating side of the housing portion in a first direction that is generally orthogonal to the opposing primary surfaces of the PCB so as to provide an exposed electrical connection for an anode of the light source. The cathode retention clip is made of an electrically conductive material and has a pair of cathode legs and a cathode mounting region. The cathode legs oppose one another and extend within the housing portion so as to project from the mounting side of the housing portion toward the illuminating side of the housing portion. The cathode mounting region connects the cathode legs together and extends along the illuminating side of the housing portion in the first direction so as to provide an exposed electrical connection for a cathode of the light source. The anode retention clip and the cathode retention clip are arranged within the housing portion so that they are electrically isolated from one another, so that the anode legs and the cathode legs will slide over and resiliently grasp the opposing primary surfaces of the PCB therebetween, so that the mounting side of the housing portion will oppose the edge surface of the PCB, and so that the anode mounting region and the cathode mounting region will secure the light source for illumination from the illuminating side of the housing portion.

According to another embodiment, there is provided an edge mounted light emitting diode (LED) assembly. The edge mounted LED assembly comprises a printed circuit board (PCB), a clip unit mounted to an edge of the PCB, and a surface mount LED having an LED anode and an LED cathode. The clip unit comprises a pair of anode legs and an anode mounting region. The anode mounting region extends between each anode leg of the pair of anode legs. The clip unit further comprises a pair of cathode legs and a cathode mounting region. The cathode mounting region extends between each cathode leg of the pair of cathode legs. The clip unit also comprises a housing portion that electrically isolates the anode mounting region and the cathode mounting region. The LED anode of the surface mount LED is mounted to the anode mounting region, and the LED cathode of the surface mount LED is mounted to the cathode mounting region.

DRAWINGS

Preferred exemplary embodiments of the invention will hereinafter be described in conjunction with the appended drawings, wherein like designations denote like elements, and wherein:

FIG. 3 is an illustration of a clip unit and an edge mount LED assembly according to one embodiment;

FIGS. 4A and 4B illustrate clip units and an edge mount LED assembly that may be used with a vehicle tail lamp;

FIG. 5 shows an edge mount LED assembly having a clip unit according to another embodiment;

FIG. 6 shows a clip unit with an LED according to one embodiment; and

FIG. 7 illustrates the clip unit of FIG. 6 without an attached light source.

DESCRIPTION

A clip unit and an edge mount light emitting diode (LED) assembly incorporating a clip unit as described herein can allow for greater flexibility when designing and positioning printed circuit boards (PCBs) with light sources in various applications. The clip unit in particular provides a modular solution for mounting a light source to an edge of a PCB in a way that can allow for more structural integrity and design options while maintaining, at least in some embodiments, a more streamlined and compact overall packaging. Accordingly, the clip unit and edge mount LED assembly may provide for the use of particular light sources in particular applications in a more cost-effective and easier to manufacture manner. Further, while a majority of the discussion of light sources herein may focus on LEDs, other light sources may be used with the disclosed clip unit, as will be described in further detail below. The clip unit and edge mount LED assembly described herein may provide an advantageous way to use a wider variety of light sources in more diverse applications.

Figure 1:
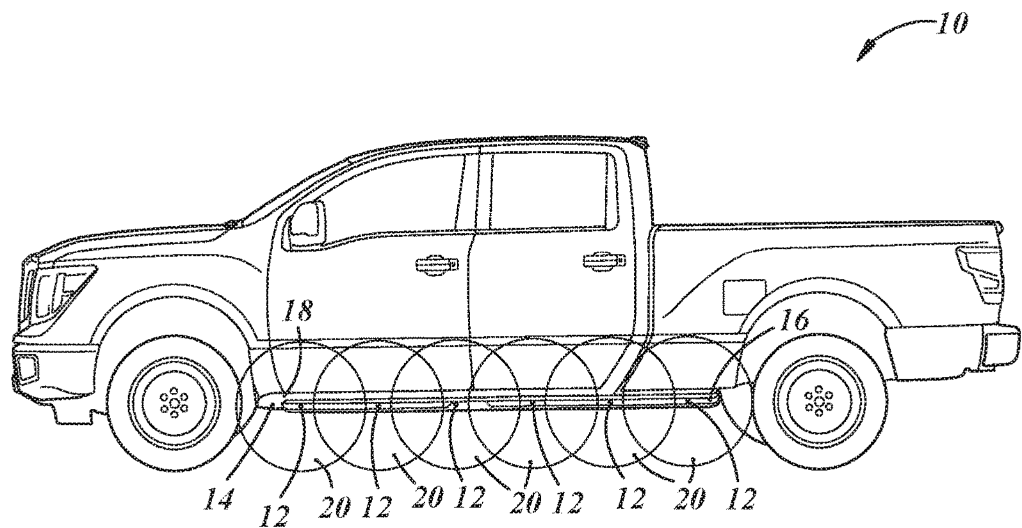
FIG. 1 is an illustration of a vehicle showing one application of the clip unit and edge mount light emitting diode (LED) assembly described herein.

FIG. 1 illustrates one particular application for the clip unit and/or edge mount LED assembly described herein. A vehicle, such as truck 10, includes a number of light sources 12 that emit light from the truck step rail 14. The truck step rail 14 includes a vertical surface 16, which is typically the thinnest overall dimension of the truck step rail, and a horizontal surface 18 which extends from the body of the truck to provide an area for a driver or passenger to step on when entering or exiting the truck 10. Emitted light 20 projects from the vertical surface 16 of the truck step rail 14 from the light sources 12. In another embodiment, not illustrated, the emitted light 20 is directed to the ground, via a waveguide or the like, to illuminate the ground near the truck step rail 14. In this embodiment and other embodiments, emitted light can project from the vertical surface 16 and/or the horizontal surface 18. The truck step rail 14 is typically a lower clearance type space, and thus the mounting configurations for installing the light sources 12 can be more limited. Additionally, the truck step rail 14 is oftentimes subject to high shock and increased vibrations. Thus, a mounting assembly having more structural integrity is desirable. For the light sources 12 of FIG. 1, it is desirable to use surface mount LEDs, as they are less expensive, oftentimes brighter, and come in a more diverse array of options. However, surface mount LEDs project light normal to the mounting surface, and accordingly, with the low-profile truck step rail 14, for example, adjustments need to be made to facilitate light emission from a horizontally mounted PCB to accommodate the use of a surface mount LED.

Figure 2:
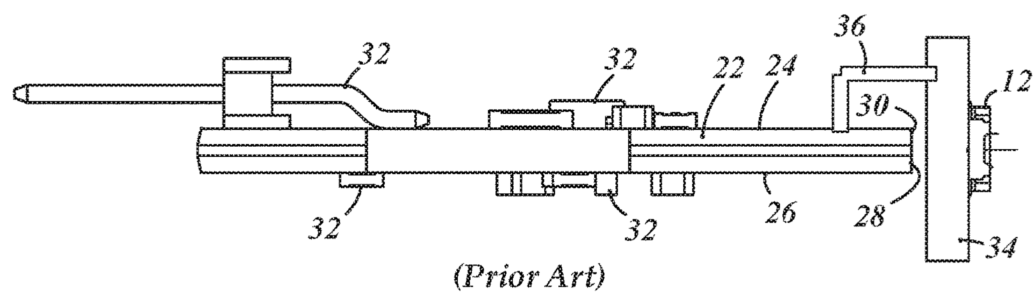
FIG. 2 is an illustration of one prior art edge mount LED assembly.

FIG. 2 shows one prior art mounting arrangement that may be used to mount a light source 12 to a PCB 22. The PCB 22 has opposing primary surfaces 24, 26 and an edge surface 28 defining an edge 30 between the opposing primary surfaces. The PCB 22 includes application specific components 32 which are variable depending on the desired PCB implementation. The PCB 22 and the light source 12 may be housed in a molded lamp housing or the like (not shown). To facilitate emission of light in a direction that is normal to the edge surface 28 (i.e., outwards away from the edge in a horizontal direction), a separate PCB 34 is used with a bridging component 36 for mounting the separate PCB 34 to the PCB 22. The separate PCB 34 holds the light source 12, and the bridging component 36, which may include header pins, wires, etc., is used to connect both PCBs 22, 34 and complete the circuit as needed. Additional molded geometry is also usually needed to support and align the separate PCB 34. The configuration illustrated in FIG. 2 is typically more expensive, more difficult to implement and manufacture, and can be more cumbersome, which is undesirable for low-profile applications.

FIG. 3 illustrates an edge mount LED assembly 40 having a clip unit 42 which may be attached to or otherwise housed in the truck step rail 14 of FIG. 1. Using the clip unit 42, the light source 12 may be mounted in a first direction 44 that is generally orthogonal to the opposing primary surfaces 24, 26 of the PCB 22. The light source 12 can illuminate or project emitted light 20 in a second direction 46 that is generally orthogonal to the first direction 44 and normal to the edge surface 28 of the PCB 22. Accordingly, when the PCB 22 is horizontally mounted, such as in the truck step rail 14 of FIG. 1, a surface mount LED may be used as a light source 12 to direct light from the projecting side 16 of the truck step rail. Advantageously, the edge mount LED assembly 40 with the clip unit 42 has a low-profile and allows for stable mounting of the light source 12 on the edge 30 of the PCB 22. Moreover, the clip unit 42 allows almost any type of light source 12 having a cathode and an anode to be reliably mounted to the edge of the PCB 22 such that it is generally oriented and projects in the second direction 46.

The edge mount LED assembly 40 and/or the clip unit 42 may be used in a multitude of applications. For example, FIGS. 4A and 4B illustrate a tail lamp 50 that includes the edge mount LED assembly 40 and a number of clip units 42. Any number of clip units 42 may be used, and they may be mounted on one edge 30 of the PCB 22, or on another edge, or on more than one edge, to cite a few examples. With the tail lamp 50, the PCB 22 is configured to be slidably mounted within an adapter 52 of the tail lamp. As shown, the PCB 22 can slide into a socket 54 in the adapter 52. This may allow for easy repairs if one or more of the light sources 12 become inoperable and need to be fixed. As illustrated, the whole edge mount LED assembly 40 may be replaced. Or, alternatively, an individual light source 12 or clip unit 42 may be replaced. Other applications besides the truck step rail 14 of FIG. 1 and the tail lamp 50 of FIGS. 4A and 4B are certainly possible. For example, any lighted interior or exterior vehicle component may include the edge mount LED assembly 40 and/or the clip unit 42. As described above, the edge mount LED assembly 40 and the clip unit 42 are particularly well suited for any thin packaging space, including but not limited to a roof rail, a sun visor, or any other low profile package. Additionally, the clip unit 42 may be used with any type of light source, such as a sensor, an organic light emitting diode (OLED), an infrared or ultraviolet illuminator, or any type of light source having an anode and cathode.

FIGS. 5-7 illustrate various embodiments of the clip unit 42. The clip unit 42 generally includes a housing portion 56, an anode retention clip 58, and a cathode retention clip 60. The housing portion has a mounting side 62 which typically abuts and/or faces the edge surface 28 of the PCB 22. Some spacing may exist between the mounting side 62 and the edge surface 28 when the clip unit 42 is attached. The housing portion also has an illuminating side 64 which usually is opposed to the mounting side 62. The anode retention clip 58 and the cathode retention clip 60 are arranged within the housing portion 56 so that they are electrically isolated from one another. Accordingly, the housing portion can be made from an electrically insulative material. In one embodiment, nylon is used as the electrically insulative material; however, any non-conductive material may be used, preferably a high temperature dielectric plastic material that can withstand the heat from soldering. Also, it may be advantageous to use a material capable of being injection molded. In one embodiment, the housing portion 56 is overmolded over the anode retention clip 58 and the cathode retention clip 60.

The housing portion 56 may be implemented in any number of configurations. For example, the housing portion 56 may vary in size and shape beyond what is illustrated. In one embodiment, the housing portion 56 is used to set a standard spacing between the PCB 22 and the light source 12. Moreover, dimensional variations of the housing portion 56 may be beneficial in certain instances. For example, a thinner housing portion 56, which may allow for less space between the PCB 22 and the light source 12, may provide more flexibility and/or a greater clamping force for the anode retention clip 58 and the cathode retention clip 60. The housing portion 56 can also set and/or maintain the spacing between the anode retention clip 58 and the cathode retention clip 60. Additionally, the housing portion 56 may include other features, such as a locating rib 66 shown in FIG. 5, to assist with either automated or manual attachment methods. The locating rib 66 may include any feature on the mounting side 62 or another side of the housing portion 56 to help facilitate placement of the clip unit 42 on the edge 30 of the PCB 22. The locating rib 66 may include two projecting structures to oppose the primary surfaces 24, 26 of the PCB 22. The locating rib 66 may alternatively include a groove that extends into the body of the housing portion that generally coincides with, or is larger than, the size of the edge surface 28 of the PCB 22. Other forms for the locating rib 66 are certainly possible.

FIG. 5 shows one variation of the housing portion 56. In this embodiment, the clip unit 42 includes a single housing portion with multiple anode retention clips 58 and multiple cathode retention clips 60. Accordingly, multiple light sources 12 may be mounted to one clip unit 42. Thus, it is possible to use different types of light sources 12 with a single clip unit. It should be noted that certain components of the clip unit 42, which will be explained in further detail with reference to FIGS. 6 and 7, are not labeled in FIG. 5 for clarity purposes.

FIGS. 6 and 7 illustrate a preferred embodiment of the clip unit 42. FIG. 6 shows the clip unit 42 with the light source 12, which in this embodiment, is a surface mount LED. FIG. 7 shows the clip unit 42 without the light source 12. The light source 12 may be mounted to the clip unit 42 before or after the clip unit is mounted to the PCB 22. The clip unit 42 can carry current to the light source 12 and can provide for a universal edge mount surface for almost any surface mount LED or surface mount light source. The anode retention clip 58 and the cathode retention clip 60 are arranged within the housing portion 56 in an isolated fashion so as to be able to carry the current from the light source 12 to the PCB 22. The anode retention clip 58 and the cathode retention clip 60 can be made of an electrically conductive material which may be blanked and then stamped, via a progressive die or the like. According to one embodiment, the retention clips 58, 60 are made of a metal, such as tin-plated brass, although other conductive materials may certainly be used.

The anode retention clip 58 includes a pair of anode legs 68, 70 and an anode mounting region 72. The anode legs 68, 70 can oppose one another and extend within the housing portion 56 so as to project from the mounting side 62. The anode mounting region 72 connects the anode legs 68, 70 together and extends along the illuminating side 64 of the housing portion 56 in the first direction 44 (see e.g., FIG. 3) that is generally orthogonal to the opposing primary surfaces 24, 26 of the PCB 22 so as to provide an exposed electrical connection for an anode 80 of the light source 12.

Like the anode retention clip 58, the cathode retention clip 60 includes a pair of cathode legs 74, 76 and a cathode mounting region 78. Like the anode legs 68, 70, the cathode legs 74, 76 can oppose one another and extend within the housing portion 56 so as to project from the mounting side 62 toward the illuminating side 64. The cathode mounting region 78 connects the cathode legs 74, 76 together and extends along the illuminating side 64 of the housing portion 56 in the first direction 44 (see e.g., FIG. 3) that is generally orthogonal to the opposing primary surfaces 24, 26 of the PCB 22 so as to provide an exposed electrical connection for a cathode 82 of the light source 12.

The anode legs 68, 70 and the cathode legs 74, 76 can slide over and resiliently grasp the opposing primary surfaces 24, 26 of the PCB 22 therebetween, so that the mounting side 62 of the housing portion 56 will abut the edge surface 28 of the PCB 22. In this arrangement, the anode mounting region 72 and the cathode mounting region 78 can secure the light source 12 for illumination from the illuminating side 64 of the housing portion 56. According to one embodiment, the anode leg 68 and the cathode leg 74 are solder legs which may be soldered to pads on the primary surface 24 of the PCB 22. In this embodiment, the corresponding anode leg 70 and cathode leg 76 may be securing legs that rest upon the opposing primary surface 26 of the PCB 22. It may also be desirable in some embodiments to solder both anode legs 68, 70 and both cathode legs 74, 76 to the PCB 22. It should also be understood that the illustrated positioning of the anode legs 68, 70 and the cathode legs 74, 76 is just an example, and may be reoriented depending on the particular circuit implementation.

Each anode leg 68, 70 and/or each cathode leg 74, 76 may include a contact portion 84 for contacting the PCB 22. The contact portion 84 may be a generally planar surface to help the flow of current from the light source 12 to the PCB 22. The contact portion 84 may include a slot 86. A slotted contact portion 84 may allow for solder flow and/or mechanical attachment to the PCB 22.

Each anode leg 68, 70 and/or each cathode leg 74, 76 may also include a transition portion 88. The transition portion 88 may extend between the contact portion 84 and the respective mounting region 72, 78. As shown in FIG. 6, the transition portion 88 in this embodiment is configured to bend away from the opposing primary surfaces 24, 26 of the PCB 22 so as to increase the length of the anode and cathode mounting regions 72, 78 and help provide spring force between the contact portions 84. With an overmolded housing portion 56, each transition portion 88 can define a leg accommodation recess in the housing portion 56, extending from the mounting side 62 to the illuminating side 64 of the housing portion.

Additionally, each anode leg 68, 70 and/or each cathode leg 74, 76 may include a flanged edge 90. The flanged edge 90 may be formed with the anode leg 68, 70 and/or the cathode leg 74, 76 during the stamping process. In the illustrated embodiments, the flanged edge 90 of the anode leg 68 flange away from the flanged edge 90 of the other anode leg 70. Similarly, the flanged edge 90 of the cathode leg 74 flange away from the flanged edge 90 of the other cathode leg 76. Accordingly, upon being mounted to the PCB 22, the flanged edges 90 extend away the opposing primary surfaces 24, 26 of the PCB 22. This outwardly flanged configuration can aid in installation, as burrs on the edges of each anode leg 68, 70 and each cathode leg 74, 76 can mar, scratch, or create drag at the surface of the PCB 22 during installation. Thus, the flanged edges 90 can provide for a rounded, smoother surface of each leg to help protect the PCB and reduce friction during manual or automated installation of the clip unit 42.

With reference to FIG. 7 in particular, it is shown that the anode mounting region 72 can include an anode terminal extension segment 92 and the cathode mounting region 78 can include a cathode terminal extension segment 94. The anode terminal extension segment 92 extends from the anode mounting region 72 toward the cathode terminal extension segment 94. Similarly, the cathode terminal extension segment 94 extends from the cathode mounting region 78 toward the anode terminal extension segment 92. Both the anode terminal extension segment 92 and the cathode terminal extension segment 94 can provide more mounting surface area for attaching the light source 12. Additionally, in this embodiment, the anode terminal extension segment 92 and the cathode terminal extension segment 94 form scalloped corners at the junction of each respective mounting region 72, 78. The terminal extension segments 92, 94 can allow for the mounting of smaller light sources that have terminals closer together, thus increasing the adaptability of the clip unit 42 to various light source sizes. In the embodiment illustrated in FIG. 6, a surface mount LED is used as light source 12 having dimensions of approximately 3 mm by 3 mm. The clip unit may be approximately 10 mm by 10 mm and have a 6 mm length from the mounting regions 72, 78 to the end of each clip 58, 60. The clips 58, 60 may be spaced approximately 0.5 mm from each other along the illuminating side 64 of the housing portion 56. However, other dimensions may certainly be used depending upon the desired implementation.

FIG. 7 also illustrates the spacing between each anode leg 68, 70 and each cathode leg 74, 76. In the illustrated embodiment, although not necessary, each anode leg 68, 70 of the pair of anode legs mirror each other across a plane 96 that bifurcates the anode mounting region 72. Further, the plane 96 may bifurcate the cathode mounting region 78 and each cathode leg 74, 76 of the pair of cathode legs may mirror each other across the plane. The spacing of each leg of the pair of legs may be determined based on the dimensions of the PCB. In one embodiment, the anode legs 68, 70 and the cathode legs 74, 76 may be spaced at a distance that is approximately 85-95%, or in one particular embodiment, 90%, of the length of the edge surface 28 of the PCB 22. The clamping force may be determined and/or adjusted based on the material used for the anode and cathode retention clips 58, 60, the angle of the transition portion 88, and/or the spacing between the respective anode legs 68, 70 and cathode legs 74, 76.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A clip unit for attaching a light source to an edge of a printed circuit board (PCB), the PCB having opposing primary surfaces and an edge surface defining an edge of the PCB between the opposing primary surfaces, the clip unit comprising:

a housing portion being made of an electrically insulative material and having a mounting side and an illuminating side;

an anode retention clip being made of an electrically conductive material and having a pair of anode legs and an anode mounting region, the anode legs oppose one another and extend within the housing portion so as to project from the mounting side of the housing portion toward the illuminating side of the housing portion, the anode mounting region connects the anode legs together and extends along the illuminating side of the housing portion in a first direction that is generally orthogonal to the opposing primary surfaces of the PCB so as to provide an exposed electrical connection for an anode of the light source; and a cathode retention clip being made of an electrically conductive material and having a pair of cathode legs and a cathode mounting region, the cathode legs oppose one another and extend within the housing portion so as to project from the mounting side of the housing portion toward the illuminating side of the housing portion, the cathode mounting region connects the cathode legs together and extends along the illuminating side of the housing portion in the first direction so as to provide an exposed electrical connection for a cathode of the light source;

wherein the anode retention clip and the cathode retention clip are arranged within the housing portion so that they are electrically isolated from one another, so that the anode legs and the cathode legs will slide over and resiliently grasp the opposing primary surfaces of the PCB therebetween, so that the mounting side of the housing portion will oppose the edge surface of the PCB, and so that the anode mounting region and the cathode mounting region will secure the light source for illumination from the illuminating side of the housing portion.

2. The clip unit of claim 1, wherein each anode leg and each cathode leg have a contact portion for contacting the printed circuit board (PCB).

3. The clip unit of claim 2, wherein the contact portion of each anode leg and each cathode leg is slotted.

4. The clip unit of claim 2, wherein each anode leg and each cathode leg have a transition portion that extends between the contact portion of each anode leg and each cathode leg to each respective anode mounting region and cathode mounting region.

5. The clip unit of claim 4, wherein the transition portion is configured to bend away from one of the opposing primary surfaces of the printed circuit board (PCB) so as to increase the length of the anode and cathode mounting regions.

6. The clip unit of claim 1, wherein the housing portion overmolds the pair of anode legs and the pair of cathode legs to form a plurality of leg accommodation recesses in the housing portion.

7. The clip unit of claim 1, wherein each anode leg of the pair of anode legs mirror each other across a plane that bifurcates the anode mounting region.

8. The clip unit of claim 7, wherein the plane also bifurcates the cathode mounting region and each cathode leg of the pair of cathode legs mirror each other across the plane.

9. The clip unit of claim 1, wherein the anode mounting region has an anode terminal extension segment and the cathode mounting region has a cathode terminal extension segment and the anode terminal extension segment extends from the anode mounting region toward the cathode terminal extension segment and the cathode terminal extension segment extends from the cathode mounting region toward the anode terminal extension segment to provide more mounting surface area for attaching the light source.

10. The clip unit of claim 1, wherein each anode leg of the pair of anode legs have a flanged edge, and the flanged edges of one anode leg flange away from the flanged edges of the other anode leg.

11. The clip unit of claim 10, wherein each cathode leg of the pair of cathode legs have a flanged edge, and the flanged edges of one cathode leg flange away from the flanged edges of the other cathode leg.

12. The clip unit of claim 1, wherein the light source is a surface mount light emitting diode (LED) having an LED anode and an LED cathode, wherein the LED anode is mounted to the anode mounting region and the LED cathode is mounted to the cathode mounting region.

13. The clip unit of claim 12, wherein the surface mount light emitting diode (LED) projects light in a second direction, wherein the second direction is generally orthogonal to the first direction and normal to the edge surface of the printed circuit board (PCB).

14. The clip unit of claim 1, further comprising:

a second anode retention clip being made of an electrically conductive material and having a second pair of anode legs and a second anode mounting region, the second pair of anode legs oppose one another and extend within the housing portion so as to project from the mounting side of the housing portion toward the illuminating side of the housing portion, the second anode mounting region connects the second pair of anode legs together and extends along the illuminating side of the housing portion in the first direction so as to provide an exposed electrical connection for an anode of a second light source; and a second cathode retention clip being made of an electrically conductive material and having a second pair of cathode legs and a second cathode mounting region, the second pair of cathode legs oppose one another and extend within the housing portion so as to project from the mounting side of the housing portion toward the illuminating side of the housing portion, the second cathode mounting region connects the second pair of cathode legs together and extends along the illuminating side of the housing portion in the first direction so as to provide an exposed electrical connection for a cathode of the second light source.

15. The clip unit of claim 14, wherein the light source is a surface mount light emitting diode (LED) having an LED anode and an LED cathode, wherein the LED anode is mounted to the anode mounting region and the LED cathode is mounted to the cathode mounting region, and wherein the second light source is a second surface mount LED having a second LED anode and a second LED cathode, wherein the second LED anode is mounted to the second anode mounting region and the second LED cathode is mounted to the second cathode mounting region.

16. The clip unit of claim 1, wherein the mounting side of the housing portion includes a locating rib for aligning the edge surface of the printed circuit board (PCB).

17. An edge mounted light emitting diode (LED) assembly, comprising:

a printed circuit board (PCB); and the clip unit of claim 1 mounted to the edge of the PCB, wherein the light source is a surface mount LED having an LED anode and an LED cathode, wherein the LED anode is mounted to the anode mounting region and the LED cathode is mounted to the cathode mounting region.

18. An edge mounted light emitting diode (LED) assembly, comprising:

a printed circuit board (PCB), wherein the PCB includes opposing primary surfaces;

a clip unit mounted to an edge of the PCB, wherein the clip unit comprises:

a pair of anode legs and an anode mounting region, wherein the anode mounting region extends between each anode leg of the pair of anode legs, a pair of cathode legs and a cathode mounting region, wherein the cathode mounting region extends between each cathode leg of the pair of cathode legs, and a housing portion that electrically isolates the anode mounting region and the cathode mounting region; and a surface mount LED having an LED anode and an LED cathode, wherein the LED anode is mounted to the anode mounting region and the LED cathode is mounted to the cathode mounting region, wherein one anode leg and one cathode leg of each of the pair of legs is a solder leg, and the other anode leg and the other cathode leg of each of the pair of legs is a securing leg and each solder leg physically and electrically attaches to a pad on one of the primary surfaces of the PCB and each securing leg rests along the opposing primary surface of the PCB.

19. A truck step rail for a vehicle comprising the edge mounted light emitting diode (LED) assembly of claim 18, wherein the surface mount LED emits light in a direction normal to a thinnest dimension of the truck step rail.

20. A tail lamp for a vehicle comprising the edge mounted light emitting diode (LED) assembly of claim 18, wherein the printed circuit board (PCB) is configured to be slidably mounted within an adapter of the tail lamp.

* * * * *